Aug. 21, 1956 B. PARZEN 2,760,074

FREQUENCY GENERATOR

Filed Dec. 20, 1951 2 Sheets-Sheet 1

INVENTOR
BENJAMIN PARZEN
BY Percy P. Lantzy
ATTORNEY

Aug. 21, 1956 B. PARZEN 2,760,074

FREQUENCY GENERATOR

Filed Dec. 20, 1951 2 Sheets-Sheet 2

INVENTOR
BENJAMIN PARZEN
BY Percy P. Lantzy
ATTORNEY

United States Patent Office 2,760,074

Patented Aug. 21, 1956

2,760,074

FREQUENCY GENERATOR

Benjamin Parzen, Forest Hills, N. Y., assignor to International Telephone and Telegraph Corporation, a corporation of Maryland Application December 20, 1951, Serial No. 262,557

2 Claims. (Cl. 250—36)

Figure 1:
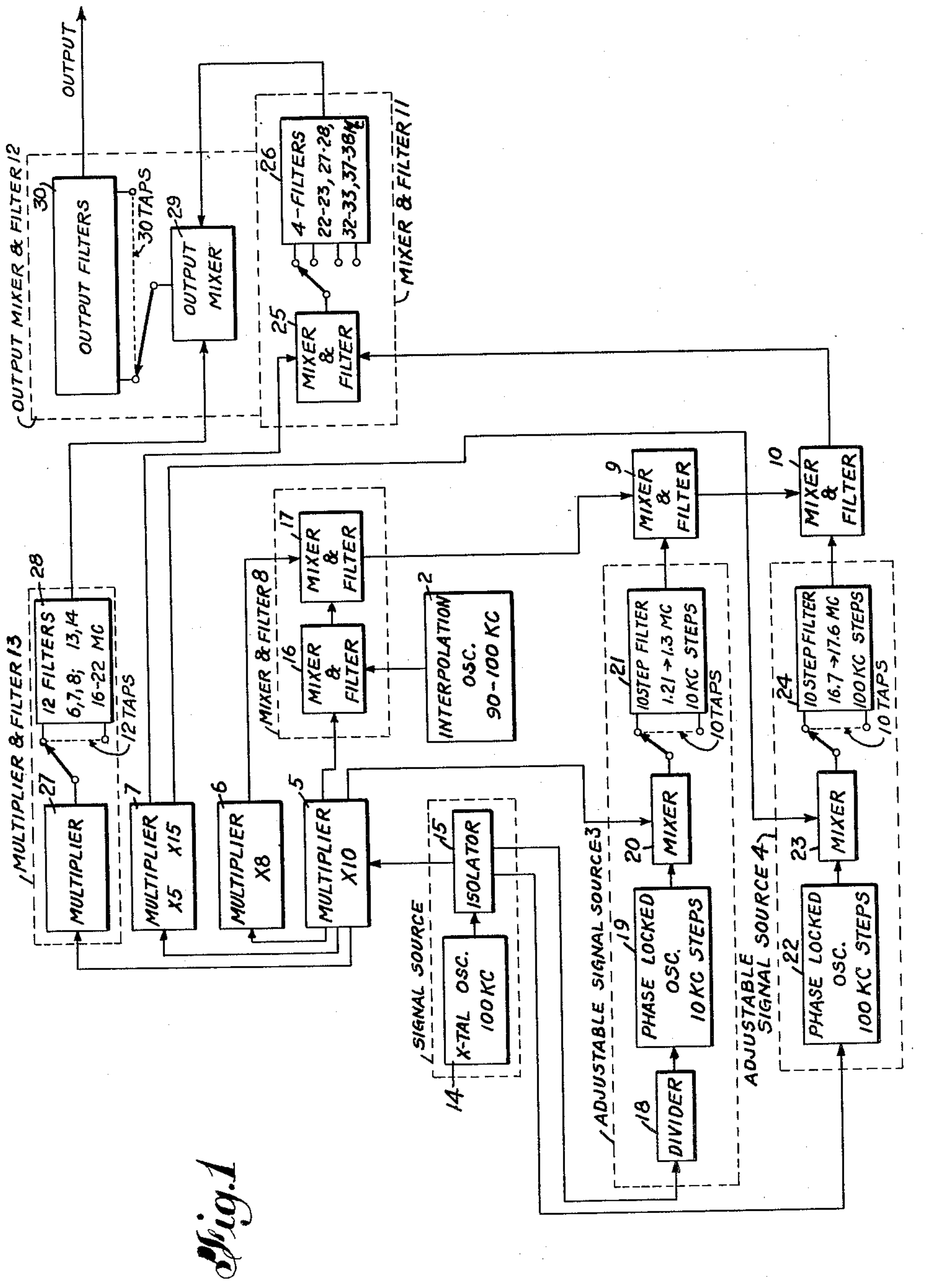

This invention relates to a frequency generators and more particularly to frequency generators capable of adjustment over a wide frequency range.

In many applications, such as for control purposes or for radio transmitters, it is desirable to have a wide band frequency generator which is very precise and capable of being set to a predetermined frequency quickly and easily. In any frequency generator, where the final output is obtained by combining two or more independent frequencies, spurious frequency responses as well as the desired frequency signals are generated. The usual method of eliminating these spurious frequencies is to use a filter circuit which will pass only the desired frequency, but in many cases the desired frequency and the spurious responses are so close that the undesired one cannot be filtered out. These spurious responses in many applications are very undesirable. With the proper selection of frequencies to be combined, it is possible to generate a desired frequency signal within a relatively wide frequency range without generating excessive unfilterable spurious frequency responses.

One of the objects of this invention, therefore, is to provide a frequency generator capable of being adjusted to any predetermined frequency over a relatively wide frequency range.

Another object of this invention is to provide a frequency generator wherein the spurious frequency responses are reduced to a minimum.

A feature of this invention is the use of high level, high impedance mixers to minimize the number of vacuum tubes, filter, and other components ordinarily believed necessary for such a wide band frequency generator.

Briefly, by this invention, the output frequency is obtained by mixing the harmonics and subharmonics of a crystal oscillator with the output of a self-excited, easily adjusted oscillator. The 90 to 100 kc. output of the oscillator is mixed with the 1 mc. and 8 mc. harmonic of a 100 kc. crystal oscillator and the output of two phase lock oscillators to produce a frequency adjustable from 27 to 28 mc. The adjustable 27 to 28 mc. signal is mixed with multiples of 5 mc. derived from harmonics of the 100 kc. crystal oscillator to produce four adjustable frequency bands which are then mixed with various harmonics of the 100 kc. crystal oscillator to give an output frequency adjustable from 0 to 30 mc. with a minimum of spurious frequency response.

Figure 2:
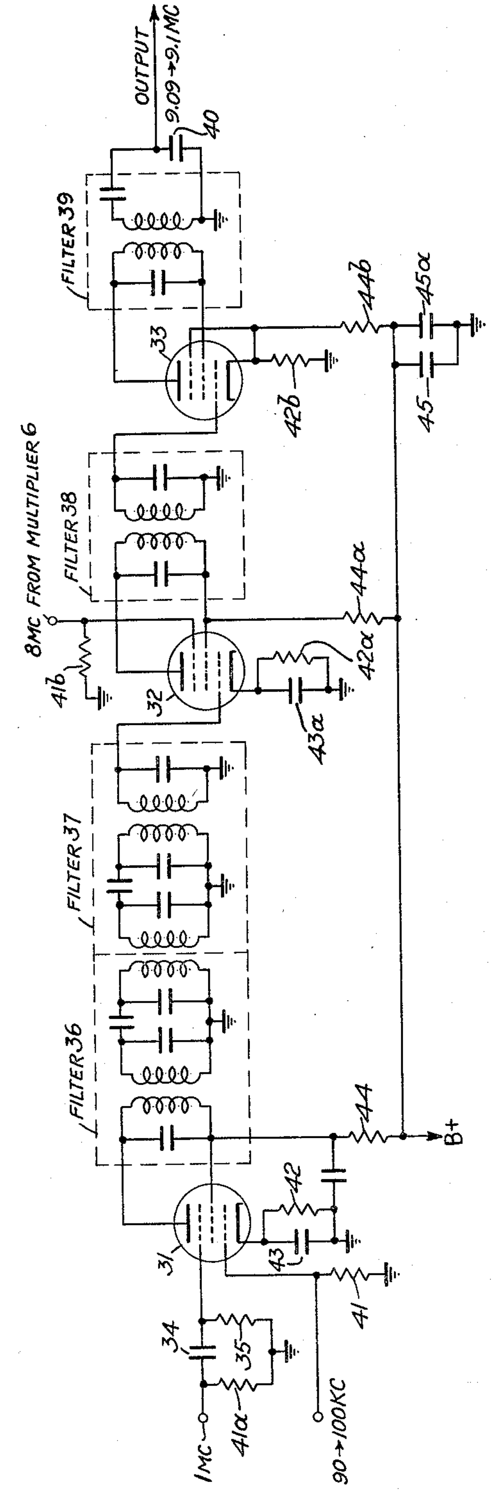

The above-mentioned and other features and objects of this invention and the manner of attaining them will become more apparent by reference to the following description taken in conjunction with the accompanying drawings, wherein:

Fig. 1 is a schematic illustration in block form of one embodiment of this invention; and Fig. 2 shows a circuit diagram of a mixer section used in this invention.

Referring to Fig. 1, wherein a preferred embodiment of this invention is illustrated, it is shown that the frequency generator comprises two signal sources: a 100 kc. signal source 1 and an adjustable frequency source 2 adjustable between 90 kc. and 100 kc. A frequency adjustable from 1.21 to 1.3 mc. in 10 kc. steps is obtained from a phase locked oscillator, mixer, and filter circuit 3. A similar circuit 4 provides a frequency adjustable from 16.7 to 17.6 mc. in 100 kc. steps. A 1 mc. signal is derived from the 100 kc. signal source 1 by a multiplier 5; the 8, 5, and 15 mc. harmonics of the 100 kc. signal are derived in multipliers 6 and 7. These various frequencies are combined and filtered in mixers 8, 9, and 10 to get an adjustable frequency signal from 27 to 28 mc. as the output from mixer 10. This adjustable 27 to 28 mc. signal is combined in mixer 11 with multiples of the 5 mc. harmonic of of the 100 kc. signal obtained from multiplier 7 to derive four frequency bands adjustable between 22 and 23 mc., 27 and 28 mc., 32 and 33 mc., and 37 and 38 mc. These four adjustable frequency bands are combined in the output mixer circuit 12 with various harmonics of the 1 mc. signal obtained from multiplier 13 to give a signal adjustable from 0 to 30 mc. as the final output of the frequency generator.

The 100 kc. signal source may be derived from an internal crystal controlled oscillator 14. It is desirable that the output from the crystal oscillator 14 have a high harmonic content which is useful to excite various multipliers. The isolator circuit 15 isolating the load from the plate circuit of the crystal oscillator 14 aids in substantially freeing the crystal oscillator 14 from any frequency shift. The 100 kc. signal is fed to the multiplier circuit 5 which may consist of two stages, the first stage multiplying the 100 kc. signal five times and the second stage doubling and filtering the output of the first stage thus producing a 1 mc. signal as the output of multiplier 5. The 1 mc. siginal from multiplier 5 is combined and filtered in mixer 16 with the output of an adjustable frequency self-exciting interpolation oscillator 2 which is adjustable between 90 and 100 kc.

For additional information on a type of interpolation oscillator that may be employed with the present invention, reference may be had to my copending application, Serial No. 258,354, filed November 27, 1951.

An 8 mc. signal is derived by multiplier 6 from the 1 mc. signal output from multiplier 5 and is combined and filtered in mixer 17 with the 1.09 to 1.1 mc. adjusted signal output of mixer 16 to produce a signal adjustable between 9.09 and 9.1 mc. as the output of mixer 17.

The 10 kc. subharmonic of the 100 kc. signal is obtained by divider circuit 18 and is used to synchronize a phase lock oscillator 19 to produce an adjustable frequency 210 to 300 kc. in 10 kc. steps. The output of the phase locked oscillator 19 is combined with the 1 mc. signal from multiplier 10 in mixer 20 to produce a signal of 1.21 to 1.3 mc. adjustable in 10 kc. steps, and the output of mixer 20 is filtered by the 10 step filter 21. The output of 10 step filter 21 is combined in mixer 9 with the 9.09 to 9.1 mc. signal output of mixer 17 to give a signal adjustable between 10.3 and 10.4 mc.

The 100 mc. signal is used to synchronize a second phase locked oscillator 22 to produce a signal adjustable between 1.7 and 2.6 mc. in 100 kc. steps. This signal is combined with the 15 mc. output signal of multiplier 7 in mixer 23 to produce a 16.7 to 17.6 mc. signal adjustable in 100 kc. steps which is filtered by a 10 step filter 24. The 10.3 to 10.4 mc. output of mixer 9 is combined in mixer 10 with the 16.7 to 17.6 mc. 10 step output of filter 24 to give a signal which is adjustable between 27 and 28 mc. The signal from mixer 10 is combined with multiplies of the 5 mc. signal output of multiplier 7 in mixer 25 to give four frequency bands adjustable between 22 and 23 mc., 27 and 28 mc., 32 and 33 mc., and 37 and 38 mc. These frequency bands are filtered by a 4 step filter 26.

The 1 mc. signal output of multiplier 5 is fed to a multiplier 27. The output of a 12 step filter 28 is the 6, 7, 8, 13, 14, and 16 to 22 mc. harmonics of the 1 mc. signal input mixer 29 with the frequency bands of the 4 step filter 26 whereby by proper selection of the frequency band from 4 step filter 26 and one of the harmonics from 12 step filter 28, a signal easily adjustable from 0 to 30 mc. may be obtained as the output from the stepped filter 30.

In any frequency generator where the final output is obtained by combining two or more independent frequencies in various manners, the elimination of spurious frequency responses is essential. If the undesired frequency be 70 db or more below the desired frequency, the spurious response can be disregarded as it will not substantially affect the output signal. Where the final output is obtained by combining two frequencies A and B in various manners such that $aA+bB$ equals the desired frequency, $a$ and $b$ being integers, responses of the following types are more than 70 db below the desired frequency and do not require any filter action to eliminate them:

1. A harmonic of B where the order $(b)$ is greater than 6;
2. A mixing product of $A+B$ where the arithmetic order $(a+b)$ is greater than 7; and
3. A mixing product of $A+B$ where the arithmetic order $(a+b)$ is 7, and the geometrical order $(a \times b)$ is 12.

Any other spurious response must be filtered. In order to be filterable, the spurious frequency must fall outside the filter pass band of the desired frequency range.

I have found for a given output frequency range, the number of important spurious responses decreases as one of the combined frequencies, B, increases, and when one of the combined frequencies, A, varies over a wide range and the other combined frequency, B, remains constant, unfilterable spurious frequencies are always generated except, when:

1. $A/B$ maximum is .143 or less for additive mixing; or
2. $A/B$ maximum is .125 or less for subtractive mixing.

It should be noted, however, that for these two conditions, a very good filter is required to reject frequency B.

In this invention the final output obtained by combining the four variable frequency bands of output from filter 26 and the 12 harmonics of the 1 mc. signal from filter 28 will always meet the conditions to minimize spurious frequency response set forth above where the final output is to be adjustable between 0 and 30 mc.

It is to be noted that the method of frequency generation disclosed in this invention does not require the 90 to 100 kc. adjustable signal to be multiplied, thus the accuracy of the final output frequency will be dependent on the per cent accuracy of the 100 kc. source±the accuracy of the 90 to 100 kc. signal.

Referring to Fig. 2, wherein the circuit diagram of mixer-filter circuit 8 is illustrated, it is shown that the mixer-filter 8 comprises three electron discharge devices 31, 32, and 33 of the pentode type. Each of the first two vacuum tubes 31 and 32 serve as a mixer. Tubes 31 and 32 have their control grid and suppressor grids coupled to the two signal inputs to be mixed, and the output is taken from the plate and fed to a filter network.

In this invention, high level, high impedance, single ended mixers are used to minimize the number of tubes. Single ended mixers being much simpler than balanced mixers do not require the delicate balancing which is necessary in balanced mixers. Single ended mixers, when used with sufficient filtering networks, will adequately reduce the spurious frequency response. Thus, in this invention sufficient filter networks must be associated with each mixer circuit to reduce the filterable spurious responses.

The adjustable 90 to 100 kc. frequency from the interpolation oscillator 2 is coupled to the control grid of a pentode type mixer tube 31. The 1 mc. signal from multiplier 5 which is to be mixed with the adjustable signal from oscillator 2 is coupled to the suppressor grid of mixer tube 31 through coupling condenser 34. A vacuum tube, such as 6AS6, having linear characteristics, high control grid-plate and suppressor grid-plate capacitance, low ratio of screen to cathode currents and low filament, plate and screen grid currents, is best suited in this application. The suppressor grid of mixer tube 31 is provided with a grid leak resistor 35. The plate output from mixer tube 31 is fed to filter network assemblies 36 and 37. Mixer tube 32 is used to mix the 8 mc. signal from multiplier 6 and the filtered output from mixer tube 31 to produce a signal adjustable between 9.09 and 9.1 mc. This signal output from tube 32 is filtered in a double tuned filter network assembly 38 and the output from filter network 38 is amplified by a vacuum tube amplifier 33. The final amplified output from tube 33 is filtered in filter assembly 39 and the output is taken through the coupling condenser 40. Input load resistors 41, 41*a*, and 41*b* are associated with each signal input, and each vacuum tube 31, 32, and 33 has the usual associated circuits comprising cathode bias resistors 42, 42*a*, and 42*b*, cathode bypass condensers 43 and 43*a*, screen filter resistors 44, 44*a*, and 44*b*, and a B+ power source filter comprising condensers 45 and 45*a*.

The mixer and filter circuit hereinbefore described is one type of mixer circuit that can be used in this invention, and it is to be clearly understood that any mixer of substantially equivalent characteristics may be substituted therefor.

While I have described above the principles of my invention with illustrative apparatus, it is to be clearly understood that this description is made by way of example only and not as a limitation to the scope of my invention as set forth in the objects thereof and in the accompanying claims.

I claim:

1. A generator for producing output frequencies over a continuous wide band, said band being divisible into a given number of main divisions, each main division being divisible into a given number of intermediate divisions, and each intermediate division being divisible into a given number of minor divisions, comprising only one crystal oscillator source of constant frequency signals having a high harmonic content and only one interpolation oscillator source of continuously adjustable frequency signals, said interpolation oscillator being continuously adjustable over only a narrow range of the order of a single one of said minor divisions, multiplier and divider means coupled to said crystal source for producing from its output a plurality of fixed harmonically related frequencies, means for shifting the output frequencies of said interpolation oscillator in minor division steps over a single intermediate division comprising a first mixing means for mixing said nterpolaton oscillator output with selected ones of a group of said harmonically related frequencies equal in number to said given number of minor divisions and spaced at successive intervals each equal to a minor division, means for shifting the output frequencies of said first mixing means in intermediate division steps over a main division comprising a second mixing means for mixing the output of sad first mixing means with selected ones of a group of said harmonically related frequencies equal in number to said given number of intermediate divisions and each spaced from the adjacent one by an amount equal to an intermediate division, and means for shifting the output frequencies of said second mixing means in main division steps over said wide band comprising a third means for mixing the output of said second mixing means with selected ones of said harmonically related frequencies separated from each other by at least a frequency equal to one of said main divisions.

2. A generator according to claim 1, wherein said main divisions are each of the order of 1 mc., said intermediate divisions are of the order of 100 kc., and said minor divisions are of the order of 10 kc., with the interpolation oscillator having a continuous adjustment over a range of 10 kc.

References Cited in the file of this patent

UNITED STATES PATENTS

| | | |
|---|---|---|
| 1,851,721 | Moles | Mar. 29, 1932 |
| 1,901,043 | Roosenstein | Mar. 14, 1933 |
| 1,985,046 | Marrison | Dec. 18, 1934 |
| 2,131,558 | Granger | Sept. 27, 1938 |
| 2,234,209 | Tollaksen | Mar. 11, 1941 |
| 2,248,442 | Stocker | July 8, 1941 |
| 2,383,005 | Marks | Aug. 21, 1945 |
| 2,445,664 | Doelz | July 20, 1948 |
| 2,581,594 | MacSorley | Jan. 8, 1952 |
| 2,640,155 | Rambo | May 26, 1953 |